United States Patent
Abbasfar

(10) Patent No.: US 12,021,548 B2
(45) Date of Patent: Jun. 25, 2024

(54) SYSTEM AND METHOD FOR EFFICIENT TRANSITION ENCODING FOR DECIMATION CDR

(71) Applicant: Samsung Display Co., Ltd., Yongin-si (KR)

(72) Inventor: Aliazam Abbasfar, Santa Clara, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 53 days.

(21) Appl. No.: 17/806,706

(22) Filed: Jun. 13, 2022

(65) Prior Publication Data

US 2023/0370094 A1 Nov. 16, 2023

Related U.S. Application Data

(60) Provisional application No. 63/340,351, filed on May 10, 2022.

(51) Int. Cl.
*H03M 13/27* (2006.01)
*H03M 13/00* (2006.01)
*H04L 1/00* (2006.01)

(52) U.S. Cl.
CPC ... *H03M 13/2778* (2013.01); *H03M 13/6575* (2013.01); *H03M 13/6577* (2013.01); *H04L 1/0071* (2013.01); *H04L 1/0041* (2013.01); *H04L 1/0045* (2013.01)

(58) Field of Classification Search
CPC ..... H04L 1/004; H04L 1/0041; H04L 1/0045; H04L 1/0061; H04L 1/0071; H03M 13/2778; H03M 13/6575; H03M 13/6577
See application file for complete search history.

(56) References Cited

U.S. PATENT DOCUMENTS

| | | |
|---|---|---|
| 5,644,582 A | 7/1997 | Denissen et al. |
| 6,195,764 B1 | 2/2001 | Caldara et al. |
| 6,272,658 B1 | 8/2001 | Steele et al. |
| 6,701,482 B2 | 3/2004 | Salvi et al. |

(Continued)

FOREIGN PATENT DOCUMENTS

| | | | |
|---|---|---|---|
| EP | 1 814 234 B1 | 1/2011 | |
| WO | WO-2020089102 A1 * | 5/2020 | ............. H04L 1/004 |

OTHER PUBLICATIONS

Kim, Beong-Jo; "Embedded video subband coding with 3-D set partitioning in hierarchical trees"; Rensselaer Polytechnic Institute; 1997; 176pp.; https://www.proquest.com/docview/304360043?pq-origsite=gscholar&fromopenview=true.

(Continued)

*Primary Examiner* — Shelly A Chase
(74) *Attorney, Agent, or Firm* — Lewis Roca Rothgerber Christie LLP

(57) ABSTRACT

A method of encoding input data. The method includes receiving a plurality of data bits of a bit stream. The method further includes forming words using the plurality of data bits to create a plurality of data packets including a first data packet. The method further includes encoding the words of the first data packet into coded words, partitioning the coded words into a plurality of blocks of M words each and integrating the coded words in each block in an interleaved order to generate a coded data packet for transmission through a communication channel.

20 Claims, 8 Drawing Sheets

(56) References Cited

U.S. PATENT DOCUMENTS

| | | |
|---|---|---|
| 6,954,885 B2 | 10/2005 | Hurt et al. |
| 7,031,350 B2 | 4/2006 | Martini et al. |
| 7,191,384 B2 | 3/2007 | Wei et al. |
| 7,346,037 B2 | 3/2008 | Yun et al. |
| 7,389,463 B2 | 6/2008 | Ramaswamy et al. |
| 7,440,513 B2 | 10/2008 | Thaler |
| 7,714,748 B1 | 5/2010 | Chaichanavong |
| 7,801,126 B2 | 9/2010 | Blanton |
| 10,305,631 B1 | 5/2019 | Howlader |
| 11,262,937 B2 | 3/2022 | Laurent et al. |
| 2005/0076285 A1 | 4/2005 | Silvus et al. |
| 2013/0051162 A1* | 2/2013 | Amirkhany ............ G11C 7/02 365/189.011 |
| 2014/0126919 A1* | 5/2014 | Anthapadmanabhan .................... H04L 1/0071 398/202 |
| 2018/0054216 A1 | 2/2018 | Sengoku |
| 2018/0109787 A1 | 4/2018 | Kadono et al. |
| 2020/0083912 A1 | 3/2020 | Chen et al. |
| 2022/0029635 A1 | 1/2022 | Wang |

OTHER PUBLICATIONS

Vaupel, Martin et al.; "Design methodology for a DVB satellite receiver ASIC"; Design Automation for Embedded Systems 3.4; Dec. 1998; pp. 255-290; https://link.springer.com/article/10.1023/A:1008809626433.

Immink, Kees A. Schouhamer, "High-Rate Maximum Runlength Constrained Coding Schemes Using Nibble Replacement," IEEE Transactions of Information Theory, IEEE, vol. 58, Oct. 2012, pp. 6572-6580.

EPO Extended European Search Report dated Jul. 31, 2023, issued in corresponding European Patent Application No. 23171659.8 (15 pages).

* cited by examiner

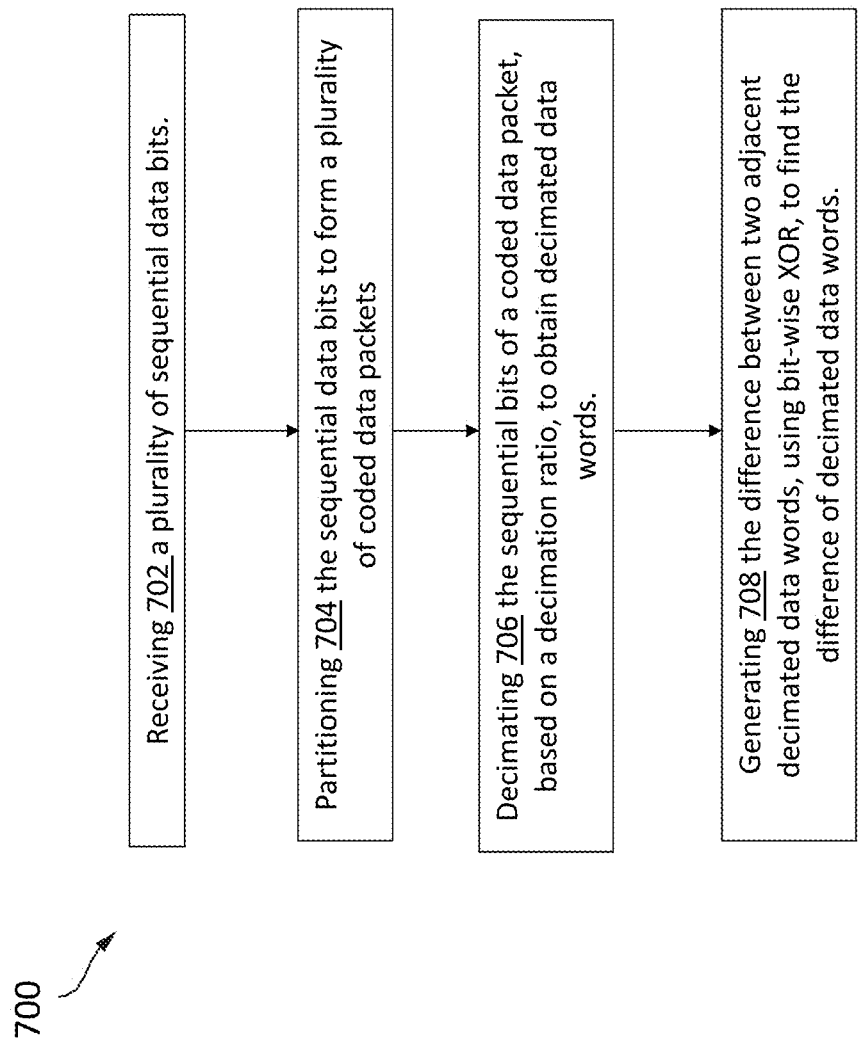

SYSTEM AND METHOD FOR EFFICIENT TRANSITION ENCODING FOR DECIMATION CDR

CROSS-REFERENCE TO RELATED APPLICATIONS

The present application claims priority to and the benefit of U.S. Provisional Application No. 63/340,351, filed May 10, 2022, the entire content of which is incorporated herein by reference.

BACKGROUND

1. Field

Aspects of one or more embodiments of the present disclosure relate to data communication systems and more specifically to transition encoding.

2. Description of Related Art

In serial link data transmission systems, a transmitter may transmit data to a receiver serially, such that the receiver receives the data one bit at a time, sequentially, over a communication channel or bus. In this case, the transmitter may embed a local clock signal along with the data into a data stream, such that a separate clock signal may not be transmitted. Accordingly, the receiver may recover the embedded clock signal from the data stream, such that the receiver may appropriately sample the data from the data stream. Such a clock and data recovery (CDR) circuit may be based on transitions (e.g., bit transitions) in the data stream, so that no transitions may correspond to no updates. Since decimation CDR's are looking at one data bit in every M bits, (e.g., decimated data), with an arbitrary initial phase, a method is needed in which there is a guaranteed transition at the given decimation ratio (M).

The above information disclosed in this Background section is for enhancement of understanding of the background of the present disclosure, and therefore, it may contain information that does not constitute prior art.

SUMMARY

One or more embodiments of the present disclosure are directed to systems and methods for transition encoding, and more particularly, to systems and methods for guaranteed transition encoding in embedded-clock serial links.

(A1) According to some embodiments of the present invention, there is provided a method comprising: receiving a plurality of input data bits of a bit stream, forming words using the plurality of data bits to create a plurality of data packets including a first data packet, encoding the words of the first data packet into coded words, partitioning the coded words into a plurality of blocks of M words each, integrating the coded words in each block in an interleaved order to generate a coded data packet for transmission through a communication channel.

(A2) According to some embodiments of the method of (A1), none of the coded words is an all-zero word.

(A3) According to some embodiments of the method of (A1)-(A2), encoding the words further comprises: encoding the words further comprises: performing a word-wise XOR on the words of the first data packet using a unique key word, wherein the unique key word is the overhead word.

(A4) According to some embodiments of the method of (A3), wherein the unique key word is different from all the words in the data packet.

(A5) According to some embodiments of the method of (A1)-(A4), encoding the words in the data packet includes: base converting the first data packet from a first base system to a second base system resulting in a base-converted packet, wherein the second-base system has a base value lower than that of the first base system.

(A6) According to some embodiments of the method of (A5), the data packet is an N-digit base $2^q$ number expressed as: $X=[x_1 x_2 \ldots x_N]2^q$, wherein each of the data words $x_1, x_2 \ldots x_N$ has a value from 0 to $2^q-2$, and wherein the base-converted packet is an $(2^q-1)$ digit base number expressed as $X=[y_0 y_1 y_2 \ldots y_N]2^q-1$ wherein each of the plurality of data words $y_0 \ldots y_N$ has a value from 0 to $2^q-1$.

(A7) According to some embodiments of the method of (A5)-(A6), the coded data packet is represented as: $[y_0+1, y_1+1, \ldots y_N+1]$, wherein each of the plurality of words $y_0+1 \ldots y_N+1$ has a value from 1 to $2^q-1$.

(A8) According to some embodiments of the method of (A5)-(A7), base converting is an iterative process.

(A9) According to some embodiments of the method of (A1)-(A8), the coded words in a first block include at least a first word, a second word and a third word,
wherein the first word, second word and third word each include at least a most significant bit, a second most significant bit and a least significant bit,
wherein integrating the coded words in an interleaved order includes:
  a) performing exclusive or (XOR) on the most significant bit of the first word with a result of a last XOR value from a previous data bit of a previous block, the previous block being adjacent to and before the first block;
  b) performing XOR on the most significant bit of the second word with a result of a last XOR value from the most significant bit of the first word,
  c) performing XOR on the most significant bit of the third word with a result of the last XOR value from the most significant bit of the second word;
  d) performing XOR on the second most significant bit of the first word with a result of the last XOR value from the most significant bit of the third word;
  e) performing XOR on the second most significant bit of the second word with a result of the last XOR value from second the most significant bit of the first word;
  f) performing XOR on the second most significant bit of the third word with a result of the last XOR value from the second most significant bit of the second word;
  g) performing XOR on the third most significant bit of the first word with a result of the last XOR value from the second most significant bit of the third word;
  h) performing XOR on the third most significant bit of the second word with a result of the last XOR value from the third most significant bit of the first word;
  i) performing XOR on the third most significant bit of the third word with a result of the last XOR value from the third most significant bit of the second word.

(A10) According to some embodiments of the method of (A1)-(A9), the size of a block is defined as: block size=W× M, wherein W is defined as word size and M is defined as a decimation ratio.

(A11) According to some embodiments of the method of (A1)-(A10), the encoding guarantees a transition at every data bit for any word size and decimation ratio.

(A12) According to some embodiments of the method of (A1)-(A10), the coded data stream has a guaranteed limited run-length.

(B1) According to some embodiments of the present invention, there is provided a method for decoding transmission data: receiving a plurality of sequential data bits; partitioning the sequential data bits to form of a plurality of coded data packets; decimating the sequential bits of the coded data packets, based on a decimation ratio, to obtain the decimated data words; taking the difference between two adjacent decimated data words, using bit-wise XOR, to find the difference of decimated data words.

(B2) According to some embodiments of (B1), auxiliary words are coded words of a data packet.

(B3) According to some embodiments of (B2), a data packet generates the decoded words out of the auxiliary words.

(B4) According to some embodiments of (B1)-(B3), the size of a data packet is less than that of the auxiliary words.

(C1) According to some embodiments of the present invention, there is provided a transition encoder for encoding input data, the transition encoder comprising: a processor; and a processor memory local to the processor, wherein the processor memory has stored thereon instructions that, when executed by the processor, cause the processor to perform: receiving a plurality of data bits of a bit stream; forming words using the plurality of data bits to create a plurality of data packets including a first data packet; encoding the words of the first data packet into coded words such that none of the coded words is an all-zero word; partitioning the coded words into a plurality of blocks of M words each, integrating the coded words in each block in an interleaved order to generate a coded data packet for transmission through a communication channel.

(C2) According to some embodiments of (C2), the transition encoder includes means for performing the method described in any one of (A1)-(A14).

(C3) According to some embodiments of (C1)-(C2), encoding the words further comprises: performing a word-wise XOR on the words of the first data packet using a unique key word, wherein the unique key word is a value of overhead word.

(C4) According to some embodiments of (C3), the unique key value is different from all the words in the first data packet.

(D1) According to some embodiments of the present invention, there is provided the transition decoder comprising: a processor; and a processor memory local to the processor, wherein the processor memory has stored thereon instructions that, when executed by the processor, cause the processor to perform: receiving a plurality of sequential data bits; partitioning the sequential data bits to form of a plurality of coded data packets; decimating the sequential bits of a coded data packet into coded words to obtain the decimated data words; taking the difference between two adjacent decimated data words to find the difference of decimated data words.

(D2) According to some embodiments of (D1), the transition decoder includes means for performing the method described in any one of (B1)-(B4).

BRIEF DESCRIPTION OF THE DRAWINGS

The above and other aspects and features of the present disclosure will be more clearly understood from the following detailed description of the illustrative, non-limiting embodiments with reference to the accompanying drawings.

FIG. 7 is a flow diagram depicting a process of decoding transmission data, according to one or more embodiments of the present disclosure.

DETAILED DESCRIPTION

Figure 1A:
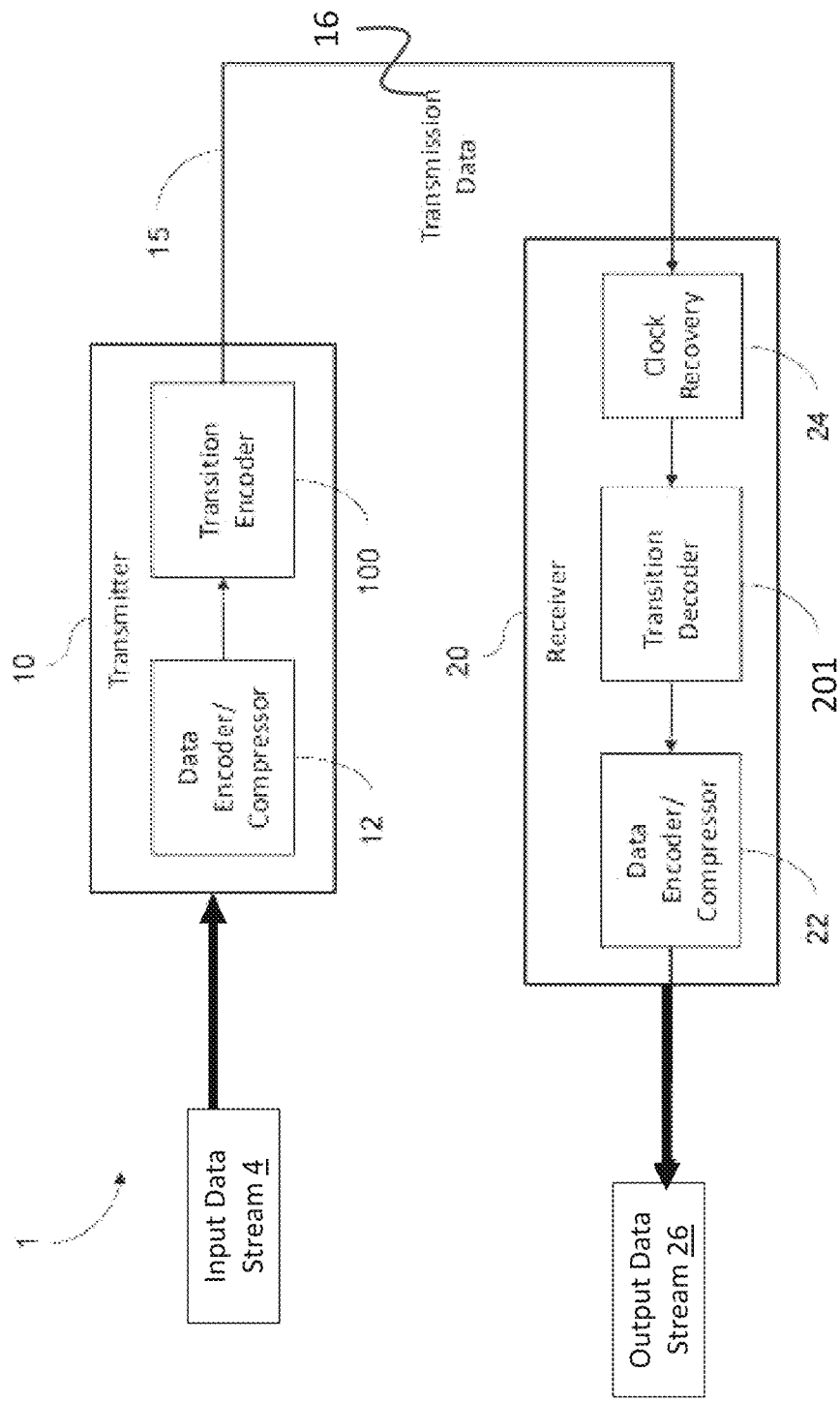
FIG. 1A is a block diagram of a serial data communication system, according to one or more embodiments of the present disclosure.

The detailed description set forth below is intended as a description of example embodiments of a system and method for transition encoding/decoding data in serial data communication, provided in accordance with the present disclosure, and is not intended to represent the only forms in which the present disclosure may be constructed or utilized.

The description sets forth the features of the present disclosure in connection with the illustrated embodiments. As denoted elsewhere herein, like element numbers are intended to indicate like elements or features.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

Referring to FIG. 1A, in some embodiments, the serial data communication system 1 may include input data stream 4, a transmitter 10, a communication channel (e.g., serial communication channel) 15, transmission data 16, receiver 20 and output data stream 26. The transmitter 10 may include, at least, a data compressor 12 for performing compression on the input data stream 4 and a transition encoder 100 for encoding the input data stream 4 to generate transmission data 16 for transmission through the communication channel 15 to the receiver 20. The receiver 20 may include, at least, a data decompressor 22 performing decompression on the data stream received by the receiver 20 and a transition decoder 201 for decoding the data stream to generate the output data stream 26.

According to some embodiments, the transmitter 10 includes a transition encoder 100 configured to encode the transmission data stream 16 by ensuring that transitions occur with at least a particular frequency (e.g., in the data packet 346 of FIG. 3), that enables the receiver 20 to extract the clock signal from the coded data stream (e.g., transition-encoded) transmitted over the communication channel 15. That is, the transition encoder 100 may limit the run-length of the coded data stream (as will be shown for data packet 346 in FIG. 3).

In some embodiments, the transition encoder 100 is configured to guarantee that transitions occur in the transmission data bit stream for any given decimation ratio, M, at least once, for a predefined bit-size of the bit stream, when the bit stream is sampling decimation positions with an arbitrary phase. For example, in FIG. 3 the data packet 346 has been marked with different hatch patterns, such that each pattern shows bits of a decimated data word (e.g., bit 330a, 330b, etc.) A different pattern illustrates different decimated data words with different phases. It is guaranteed that a transition happens in a group of bits with the hatch pattern (i.e., bits of decimated data words), at least once. This will be further expanded on in the description for FIG. 3.

The predefined bit-size of the decimated bit stream may be equal to the word size, W, in a data packet. In other words, the bits that make up the decimated words, (e.g., the equivalent bits of the bit stream) should have at least one transition.

Transitions may not simply be the difference between adjacent bits of the decimated bits. Instead, transition should be understood as the difference of a bit and its previous bit at the output of the encoder, i.e. the transmission data bits, being looked at decimation positions with an arbitrary phase.

In some embodiments, a block size of a bit stream is expressed as Block Size=W×M, wherein W is defined as word size and M is defined as a decimation ratio. In some embodiments, the transition encoder 100 is configured to guarantee that consistent transitions occur in a bit stream, for any pre-defined decimation ratio, M. As a first example, consider a decimation ratio (M) of 4, and a word size (W) of 8; as a result the block size may be 32 bits, and a given block may be 1101_1111_0000_0011_0001_1100_1101_1011. When the bit stream is decimated, the bit stream is sampled once every 4 bits, when the decimation ratio is 4. As such, we may come up with 4 decimated words, depending on which bit is chosen to start the decimation. If we start with the first bit, the decimated word may be 11000111, which is the decimated word with the first phase. However, if we start with the $2^{nd}$ bit, we get 11000110. Similarly, if we start with the $3^{rd}$ bit, we get 01010001. If we start with the $4^{th}$ bit, we get 11011011.

Figure 1B:
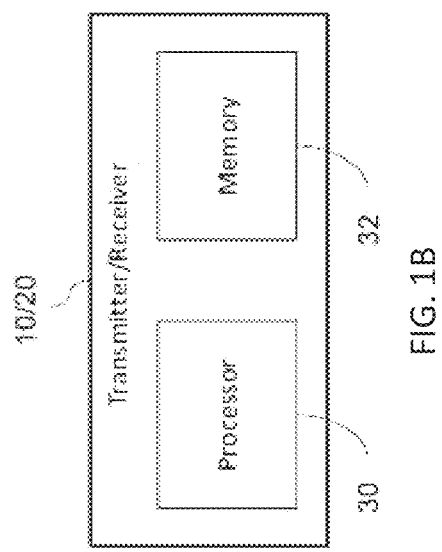
FIG. 1B illustrates a block diagram of a transmitter/receiver of the serial data communication system, according to some embodiments of the present disclosure.

As shown in FIG. 1B, the operations performed by the constituent components of the transmitter 10 and the receiver 20 may be performed by a "processing circuit" or "processor" 30 that may include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example, a processing circuit may include two processing circuits, an FPGA and a CPU, interconnected on a PWB. A processor memory 32 that is local to the processor 30 may have stored thereon instructions that, when executed by the processor 30, cause the processor 30 to perform the operations described herein with respect to FIGS. 1A and 2-7.

Figure 2A:
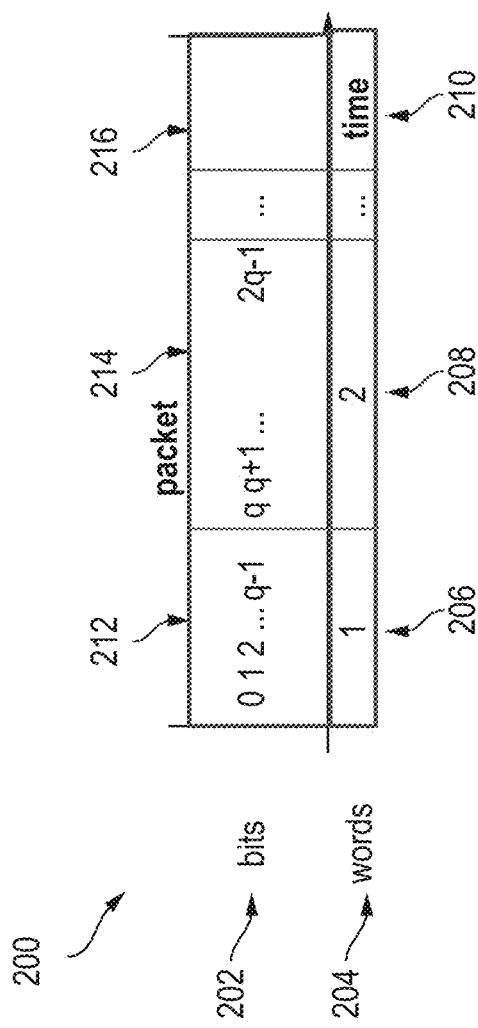
FIG. 2A illustrates a packet of data that is partitioned into a number of words, according to one or more embodiments of the present disclosure.

FIG. 2A illustrates a data packet 200 that is partitioned into a number of words 204, according to one or more embodiments of the present disclosure. In some embodiments, the data packet 200 is partitioned into several blocks, each block including a number of words. For example, if a data packet has 119 words, 8-bit each, a coded data packet may then include: overhead (8-bit)+119 coded words (8 bit)=total 120 words. In this example, the data packet may have 30 blocks of 4 words each, for a total of 120 words.

Referring to FIG. 1A, in some embodiments, the transition encoder 100 (e.g., using a transition encoder algorithm) divides the input data packet into a number of data packets. The data packet 200 may include some consecutive words, as shown by words 206, 208 and 210. The data packet 200 may be partitioned into N words (e.g., digits) where each word contains q bits. Thus, the input data packet X may be expressed as:

$$X[0:q \times N-1] = x_1(b[0:q-1]), x_2(b[q:2q-1]), \ldots, x_N(b[q \times (N-1):(q \times N)-1]) \quad \text{(Eq. 1)}$$

where $x_1, x_2, \ldots, x_N$ represent the N words making up the input data packet. Each word may represent a digit that has a value between 0 to $2^q-1$. In the example of FIG. 2A, if each word includes 6 bits (i.e., q=6) then each word/digit has a value in the [0:63] range.

First set of data bits 212 of data packet 200 can include bits 0 1 2 . . . q−1. First set of data bits 212 can be partitioned to make up a first word 206. Second set of bits 214 can include bits q, q+1 . . . 2q−1. Second set of bits 214 can be partitioned to make up a second word 208. As the data progresses over time, the number of words that are generated in a given data packet 200 can increase based on the amount of data that is transmitted/received. In some embodiments, the number of words in the data packet 200 are limited. In some embodiments, the number of words in the data packet 200 are unlimited. The number of bits in a word can be the same throughout the data packet 200. In some embodiments, the number of bits that make up a word are different.

Figure 2B:
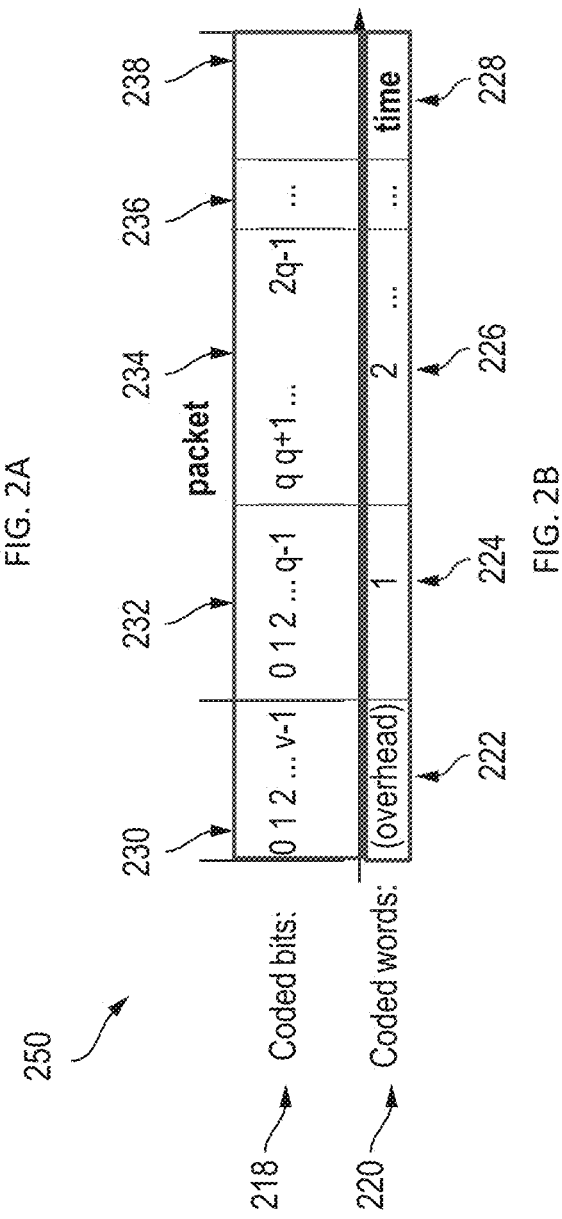
FIG. 2B illustrates a coded packet of data that is partitioned into a number of coded words, according to some embodiments of the present disclosure.

FIG. 2B illustrates a coded data packet that is partitioned into a number of coded words, according to some embodiments of the present disclosure. Importantly, the coded data packet 250 (e.g., when compared to data packet 200 in FIG. 2A) includes coded bits 218, coded words 220 and some additional data bits known as overhead bits 222. Overhead bits are defined as the bits that are generated and added by the encoder to convey the information helping the receiver decode the encoded data packet.

Referring to FIG. 1A, in some embodiments, the transition encoder 100 encodes the data packet 250 (that may have been encoded and/or compressed by the data compressor and/or encoder) into a coded data packet 250. In some embodiments, the transition encoder 100 guarantees transitions in the bit stream by encoding the data packet. The encoding methods are further detailed in FIG. 3.

For example, coded data packet 250 includes a first set of data bits 230, i.e., overhead bits, a second set of data bits 232, a third set of data bits 234, a fourth set of data bits 236 and a fifth set of data bits 238. The first set of coded bits 230 can include data bits 0 1 2 . . . v−1, second set of coded bits 232 can include 0 1 2 . . . q−1 and the third set of coded bits 234 can include q q+1 . . . 2q−1. The first set of data bits 230 may be partitioned to form overhead word 222, the second set of data bits 232 may be partitioned to form a first coded word 224, the third set of data bits 234 may be partitioned to form a second coded word 226, etc. As time progresses, the number of coded bits may increase, resulting in an increased number of coded words.

Figure 3:
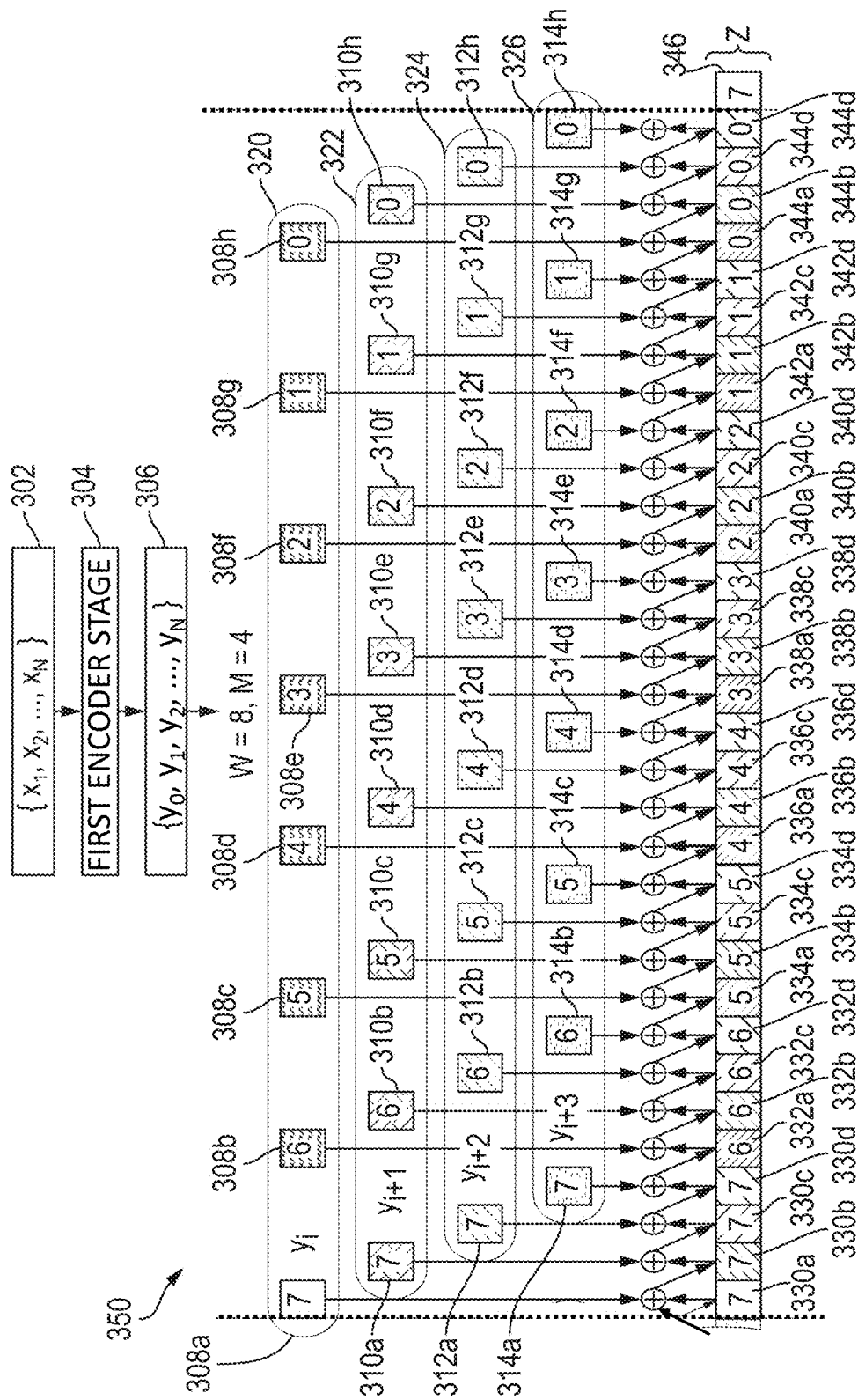
FIG. 3 illustrates encoding a packet on N words using a two-stage encoding method, resulting in a transmission data bits of FIG. 1A according to one or more embodiments of the present disclosure.

FIG. 3 illustrates encoding a packet on N words 302 using a two-stage encoding method, resulting in a coded data packet 346, expressed as z. FIG. 3 includes a packet of N words 302, a first stage encoder 304, a packet of coded words 306, partitioned coded words including first coded word 320, second coded word 322, third coded word 324 and fourth coded word 326 and generated coded data packet 346.

A packet of N words may be received by transition encoder 100. The packet of N words is expressed as $\{x_1, x_2 \ldots, x_N\}$, where $x_1$ is a word in the most significant position and $x_N$ is a word in the least significant position. The packet of N words may be encoded by the transition encoder 100 using a first encoder stage 304 for encoding the packet of N words 302 such that there is no all-zero pattern in the coded words. The first encoder stage 304 generates a packet of coded words 306. The packet of coded words may be expressed as $\{y_0, y, y, \ldots, y_N\}$ wherein $y_0$ is an overhead bit.

A. First Stage Encoder

A number of different encoding methods may be used by transition encoder 100 in the first encoder stage 304 to encode the words of the first data packet into a packet of coded words 306, such that none of the coded words in the packet of coded words 306 is an all-zero.

As a first example, an encoding method that may be used is an XOR encoding method. In this particular method, the transition encoder 100 may encode the words in the packet of N words 302 by using a unique word or unique key value, D. In some embodiments, the unique key word, D, is a different value from all the words in the packet of N words 302. As such, the transition encoder 100 may encode the packet of N words 302 by performing bit-wise XOR of each word in the packet of N words with a unique key word, D.

For example, if q=6, N=31, and the data packet is $\{x_1, x_2 \ldots, x_{30}\}=\{0, 1, \ldots, 30\}$, we can find the key word to be D=31, which is different from all the words in the data packet. The coded words are bitwise XOR of words in the data packet with D=31, which are $\{31, 30, \ldots, 1\}$. We notice that none of the coded words have an all-zero pattern, i.e. zero value.

As a second example of an encoding method that may be used is an arithmetic encoding (e.g., base conversion method). In this particular method, the transition encoder 100 performs base conversion on the packet of N words 302 from a first base system (e.g., a first base of $2^q$) to a second base system (e.g., a second base of $2^q-1$) resulting in a base-converted packet. In other words, the arithmetic encoding method converts the packet of N words/digits from a first base of $2^q$ to a second base of $2^q-1$, resulting in N+1 words/digits. In some embodiments, the second-base system has a base value lower than that of the first base system.

For example, the packet of N words 302 is an N-digit base $2^q$ number expressed as: $X=\{x_1, x_2, \ldots, x_N\}2^q$. In other words, the notation $2^q$ represents the base of the packet of N words. As such, we regard the packet of N words 302 as an N-digit base-$2^q$ number, where $x_1$ is in the most significant digit and $x_N$ is in the least significant digit, wherein q is a digit number. If, for example, q=8 for the packet of N words, then $2^q=256$. As such, every word in the packet of N words represents an 8 bit number, which has a value from 0-255, wherein X is a multi-digit number (X) in base 256). Using this base conversion method for encoding, the base-converted packet is a $2^q-1$ digit base number expressed as:

$$X=[y_0\,y_1\,y_2 \ldots y_N]2^q-1 \tag{Eq. 2}$$

For example, when q=8, each of the plurality of words (e.g., $y_0$ to $y_N$) has a value from 0 to 254. That is to say, 254 is the base maximum value of each digit. The resulting coded data packet is expressed as as:

$$[y_0+1, y_1+1, y_2+1 \ldots y_N+1] \tag{Eq. 3}$$

wherein each of the plurality of words $y_0+1 \ldots y_N+1$ has a value from 1 to 2q−1.

That is the coded digits exclude 0.

The transmitter 10 (e.g., the transition encoder 100) transmits the coded packets as a transmitted data stream to the receiver 20. When recovering the clock signal from the coded packets received through the communication channel 15, the clock recovery circuit 24 of the receiver 20 may update the coded packet N times (e.g., once for each word/digit).

While a particular low-complexity base-conversion technique is described herein, embodiments of the present disclosure are not limited thereto, and as will be recognized by a person of ordinary skill in the art, any suitable base conversion technique may be utilized by the transition encoder 100 and transition decoder 201. For example, in converting the data packet from base 64 to base 63, the transition encoder 100 may convert the data packet from base 64 to base 10, and then convert from base 10 to base 63.

B. Second Encoder Stage

The second stage of the encoding method includes partitioning the coded words 306 into a plurality of coded blocks of M words each, and encoding each block into a block of the output data stream. For example, first coded word 320, second coded word 322, third coded word 324, and fourth coded word 326 are partitioned into a first coded block 350. The size of a block is defined as:

$$\text{block size}=W \times M \tag{Eq. 4},$$

in which W is defined as word size and M is defined as a decimation ratio. Many other coded blocks may be generated before and after first coded block 350 (for purposes of brevity, these additional coded data blocks are not shown. However, it should be noted that the method and characteristics described in reference to first coded block 350 would apply to the other data blocks as well).

The second stage of the encoding process includes, after partitioning the coded words into a plurality of blocks, integrating the coded words 320, 322, 324 and 326, in each block in an interleaved order to generate coded data packet 346 of the output data stream, for transmission through a communication channel. Interleaving requires using the most significant bit from each word 320, 322, 324, and 326, and then the next most significant bit, and so forth in an iterative process, until every bit of each word is interleaved. Additionally, Integrating the coded words includes performing exclusive or (XOR) on each incoming data bit with a result of a last XOR value from a previous data bit. That is, as each bit is "taken into" the interleaving process, it is XOR'd with the result of the previous bit being entered in the data packet 346, and that XOR value is entered into the data packet 346. This process will be described in more detail below.

As an example of integrating the coded words in an interleaved order, transition encoder 100 may begin with the most significant bits of first coded word 320, second coded word 322, third coded word 324 and fourth coded word 326, The transition encoder 100 may perform XOR on each incoming data bit of each coded word, with the result of the last XOR value from a previous data bit of the coded data packet 346, to create the first four coded bits 330a, 330b, 330c, 330d of the coded data packet 346. If the very first bit is the start of the data packet 346, it may not be XOR'd. However, if the first bit of the block is not the start of the packet 346, it may be XOR'd with the final bit generated by the previous block.

For example, transition encoder 100 can select the most significant bit 308a of the first coded word 322 of first coded data block 350, and integrate this into coded data packet 346 by performing XOR on bit 308a with a result of the previous data bit from the previous data block (not shown). In performing an XOR on data bit 308a with a result of the last data bit of previous data block in coded data packet 346, a coded data bit 330a may be generated. Moving to the most significant bit 310a of second coded word 322, an XOR function is performed on data bit 310a with the result of the previous data bit 330a, resulting in coded data bit 330b in coded data packet 346. Next, as this is an iterative process, we move to the most significant bit 312a of the third coded word 324 and perform XOR on bit 312a with the result of the last XOR value of the precious data bit 330b, resulting in coded data bit 330c of coded data packet 346. Next, we move to the most significant bit 314a of coded data word 326, and XOR on data bit 314a with a result of a last XOR value from previous data bit 330c to create the next bit 330d. Since the most significant bits of coded words 320, 322, 324, and 326 have been interleaved, the process moves on to the next most significant bits of the coded words: 308B, 210B, 312B, and 314B, respectively, to create the coded stream bits 332a-332d. All bits of coded words 320, 322, 324 and 326 are thus integrated in coded data block 350 in an interleaved order to generate coded bits 330a-344d of coded data packet 346.

Figure 4:
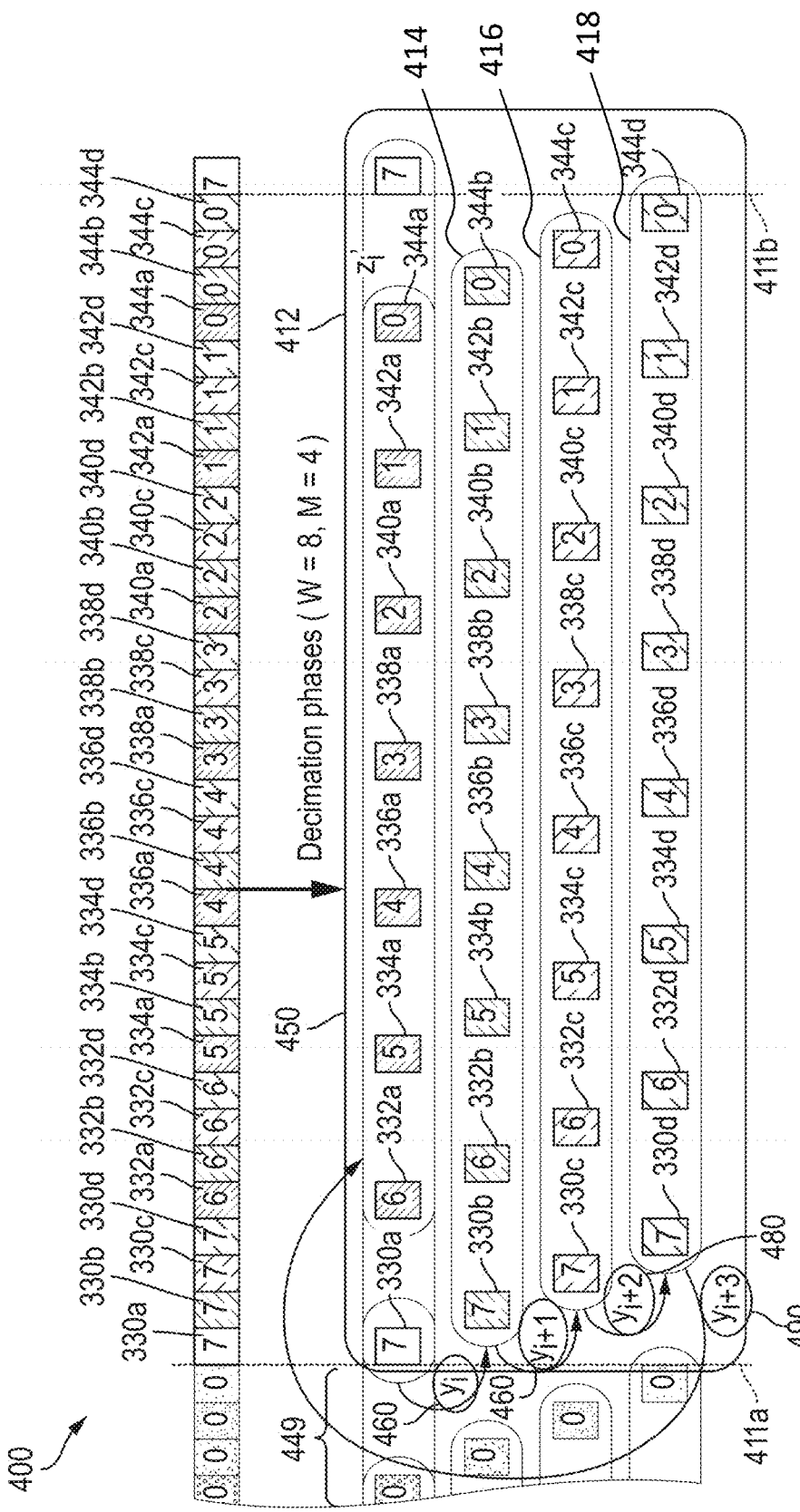
FIG. 4 illustrates decoding the received bit stream of FIG. 3, according to one or more embodiments of the present disclosure.

FIG. 4 illustrates a coded data stream 400 for decoding, according to one or more embodiments of the present disclosure. In some embodiments, the process of decoding, as will be described, is the opposite of the encoding process described in reference to FIG. 3. In some embodiment, the decoding process includes one or more reverse processes of the encoding method described in reference to FIG. 3.

A plurality of sequential data bits (e.g., 330a through 344d) may be received by the decoder 201 of receiver 20. As shown in FIG. 4, coded data stream 400 includes a plurality of sequential data bits (e.g., data bits 330a, 330b, 330c, 330d, 332a, 332b, 332c, 332d, 334a, 334b, 334c, 334d, 336a, 336b, 336c, 336d, 338a, 338b, 338c, 338d, 340a, 340b, 340c, 340d, 342a, 342b, 342c, 342d, 344a, 344b, 344c, and 334d, which may now be referred to as sequential data bits 330a-344d), coded data packets (e.g., first coded data packet 450) that are formed from the plurality of sequential data bits 330-344d, decimated data words (e.g., first decimated data word 412, second decimated data word 414, third decimated data word 416, and fourth decimated data word 418) that are formed at least based on a decimation ratio, and auxiliary words (e.g., first auxiliary word 460, second auxiliary word 470, third auxiliary word 480 and fourth auxiliary word 490) that are formed at least based on the reverse of the encoding method used in first encoder stage 304 described in FIG. 3). In some embodiments, the size of the first coded data packet 350 is less than that of the auxiliary words.

First Stacie Decoder

A detailed walk through of the decoding method is now described, with reference to FIG. 4. A plurality of sequential data bits 330a-344d may be received by the transition decoder 201. In some embodiments, the sequential data bits are partitioned (as indicated by partition break lines 411a and 411b) to form or generate a plurality of coded data packets (e.g., a block of data). For brevity purposes, coded data packet 450 is shown but a number of coded data packets may be formed before or after coded data packet 450. The sequential bits of coded data packet 450 may be decimated in order to obtain the decimated data words. For example, in FIG. 4, the decimation ratio may be M=4. With a decimation ratio of 4, sequential data bits 330a-344d are decimated by taking a bit every fourth bit. For example, in forming coded data word 412 (expressed as $z_i$), the decoder 201 may take first sequential data bit 330a and then take every fourth data bit after sequential data bit 330a, until arriving at last sequential data bit 344d, in order to form first coded data word 412. Using this process first decimated data word 412 is made up of sequential data bit 330a, sequential data bit 332a, sequential data bit 334a, sequential data bit 336a, sequential data bit 338a, sequential data bit 340a, sequential data bit 342a and sequential data bit 344a. Similarly, using this process, second decimated data word 414 (expressed as $z_{i+1}$) includes or is made up of sequential data bits 330b, 332b, 334b, 336b, 338b, 340b, 342b and 344b. Similarly, using this process, third decimated data word 416 (expressed as $z_{i+2}$) is made up of sequential data bits 330c, 332c, 334c, 336c, 338c, 340c, 342c and 344c. Similarly, using this process, fourth decimated data word 418 (expressed as $z_{i+3}$) is made up of sequential data bits 330d, 332d, 334d, 336d, 338d, 340d, 342d and 344d. In some embodiments, transition encoder takes the difference between two adjacent decimated data words by performing a bit-wise XOR, to find the difference of decimated data words. In this way, the decoding method may generate or form auxiliary words ($y_i$) by taking the difference between two adjacent decimated data words by performing a bit-wise XOR. As such, auxiliary words may be the difference between adjacent decimated data words.

The decimated data words 412-418 may be expressed as $$Z = \{z_i, z_{i+1}, z_{i+2}, \ldots z_{i+M-1}\} \quad \text{(Eq. 5)}$$

wherein $z_i, z_{i+1} \ldots z_{i+M-1}$ may be different coded bits of data packet 450.

An example of performing XOR on two adjacent decimated data words is provided below.

$$y_i = z_i \oplus z_{i+1} \neq 0 \quad \text{(Eq. 6)}$$

$$y_{i+1} = z_{i+1} \oplus z_{i+2} \neq 0 \quad \text{(Eq. 7)}$$

$$y_{i+M-1} = z_{i+M-1} \oplus z_i' \neq 0 \quad \text{(Eq. 8)}$$

The difference between z words is expressed as: $\{y_i, y_{i+1}, y_{i+2}, \ldots, y_{i+M-1}\}$ of which M is the decimation ratio. In some embodiments, $z_i'$ 491 is introduced into the coded data stream 400 for a guaranteed transition in the last word 418 of the first data packet 450 as well.

Second Stage Decoder

The second stage decoder decodes the auxiliary words into N words of a data packet. For example, since the data packet of decimated words is expressed as: $\{y_0, y_1, y_2, \ldots, y_N\}$. Using the reverse of the encoder method used by first stage encoder 304 (e.g., XOR encoding method or arithmetic encoding method), a data packet of N words is generated, which may be expressed as: $\{x_1, x_2, \ldots, x_N\}$.

Figure 5:
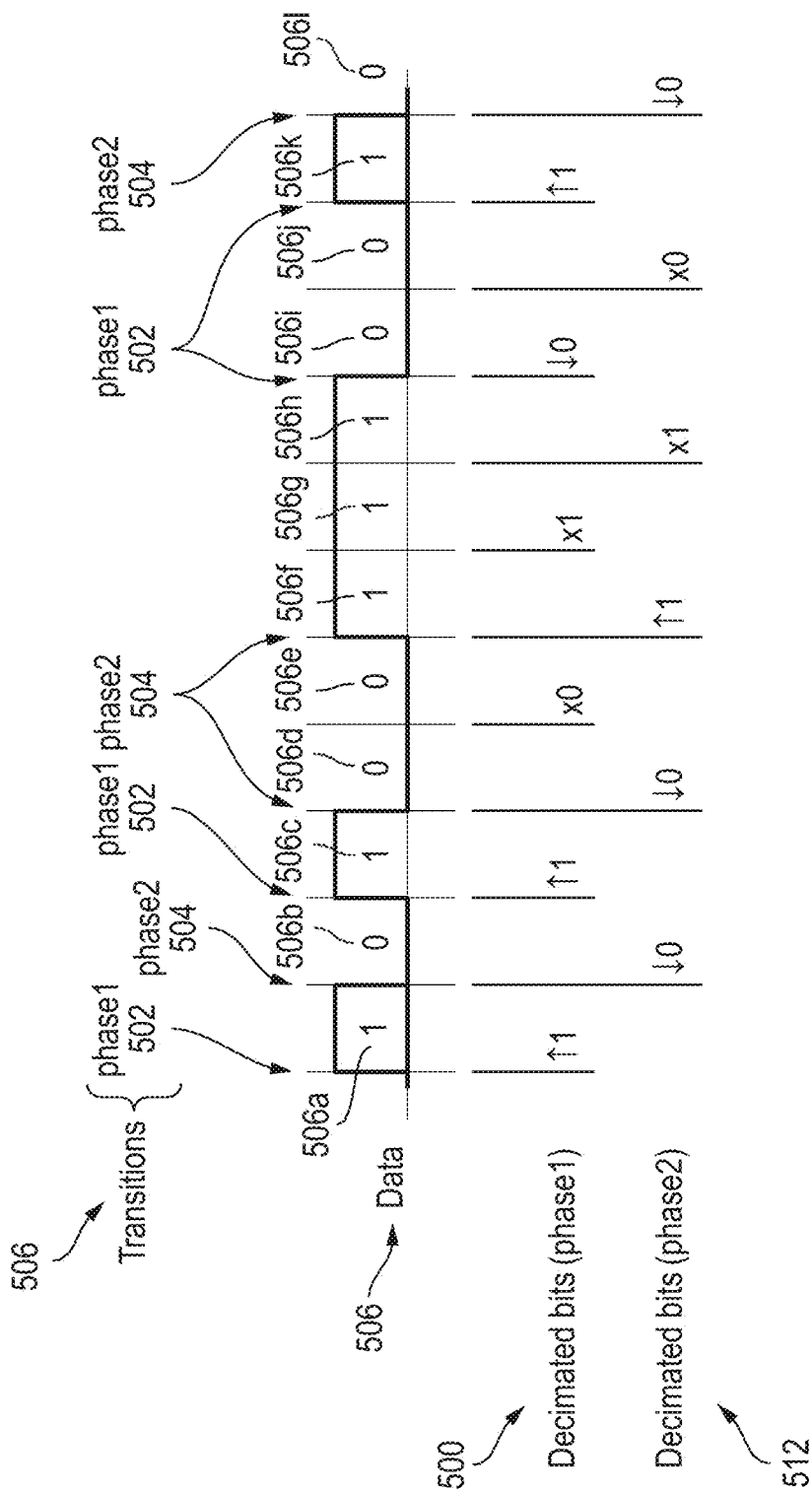
FIG. 5 illustrates the decimated data bits of a received bit stream and the presence or absence of transitions across the bit stream, according to one or more embodiments the present disclosure.

FIG. 5 illustrates the decimated data bits of a received bit stream and the presence or absence of transitions across the bit stream for decimation ration of M=2, according to one or more embodiments of the present disclosure. Bit stream 506 includes various data bits 506a to 506k. Because the decimation ratio is 2, we have 2 phases, shown as first phase 502, second phase 504, which results in decimated bits of first phase 500 and decimated bits of second phase 512. The encoding method described in reference to FIG. 3 above guarantees a transition in decimated bits in all phases, for any word size or decimation ratio. For example, as shown in FIG. 5 for a given decimation ratio of M=2, the first phase 502 has a transition in the bit stream, as shown by data bit 506a, data bit 506c, data bit 506i and data bit 506k. Similarly, the second phase 506 also has a guaranteed transition, as shown by transitions occurring at data bit 506b, data bit 506d, data bit 506e and data bit 506l.

As such, one of the improvements offered by the method described herein is that the CDR at the receiver 20 works on decimated data, with a decimation ratio of M. As such, the CDR 24 in FIG. 1A just looks at one bit every M bits in the received data stream. This makes the CDR 24 much more efficient since it processes only 1/M of the data bits, and the rest are ignored. This is different from existing solutions that look at all received data bits, leading to inefficiency. In some embodiments, since the method presented herein decimates the incoming bits in the decoder 201, we gather decimated words for all the phases, effectively processing all the bits.

Figure 6:
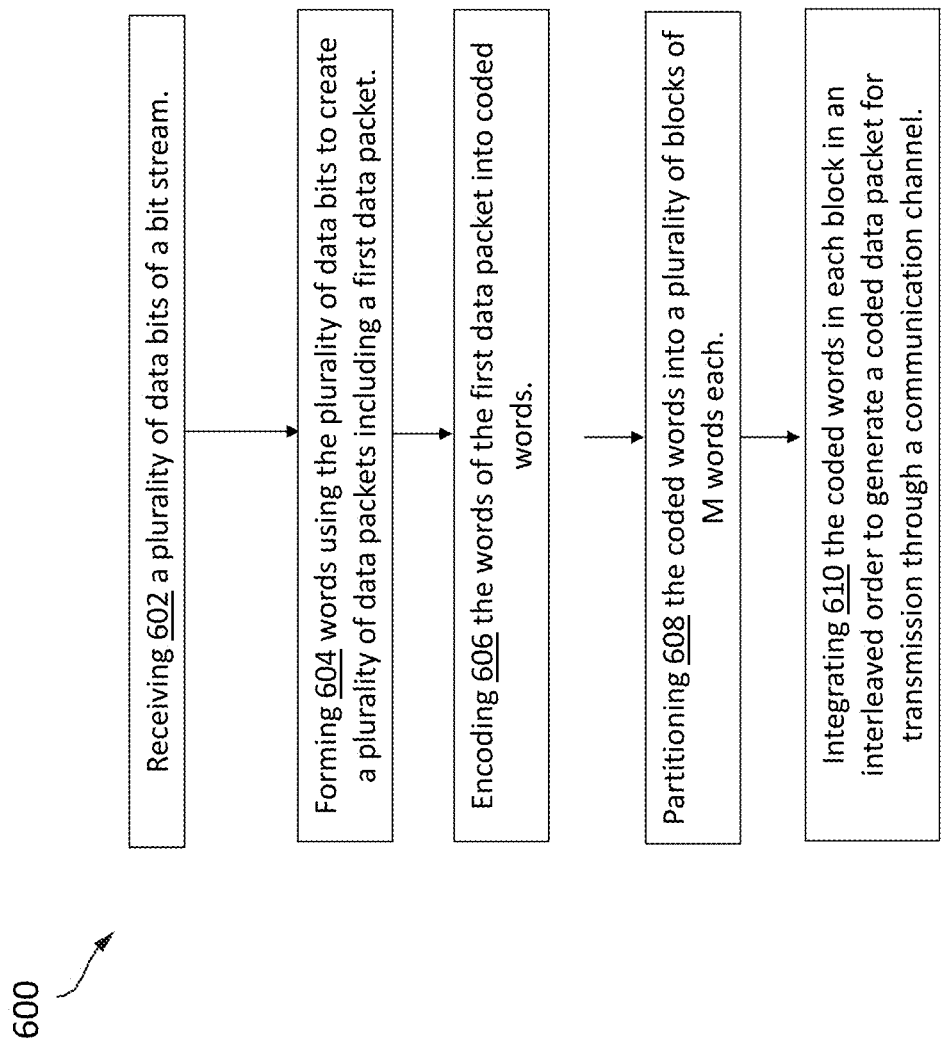
FIG. 6 is a flow diagram depicting a process of encoding input data, according to one or more embodiments of the present disclosure.

FIG. 6 is a flow diagram depicting a method 600 of encoding input data, according to one or more embodiments of the present disclosure. Operations of the method 600 may be performed by a transition encoder (e.g., transition encoder 100, FIG. 1) or by one or more components thereof (e.g., those described above with reference to FIG. 1A-1B). It is noted that aspects of the method have already been described above in FIG. 3. Therefore, for the sake of brevity, those aspects already covered are generally not repeated here.

The method 600 includes receiving 602 a plurality of data bits of a bit stream.

The method 600 further includes forming 604 words using the plurality of data bits to create a plurality of data packets including a first data packet.

The method also includes encoding 606 the words of the first data packet into coded words such that none of the coded words is an all-zero word. In some embodiments, encoding the words further comprises: raising each data bit in each word to a unique key value for exponentiation of each data bit, wherein the unique key value is a value of overhead bits. The unique key value may be different from all the words in the data packet. In other embodiments, encoding the words in the data packet includes: base converting the first data packet from a first base system to a second base system resulting in a base-converted packet, wherein the second-base system has a base value lower than that of the first base system. In some embodiments, the data packet is an N-digit base $2^q$ number expressed as: $X=[x_1\ x_2\ \ldots\ x_N]2^q$, wherein each of the data bits $x_1, x_2 \ldots x_N$ and wherein the base-converted packet is an $(2^q-1)$ digit base number expressed as $X=[y_0 y_1 y_2 \ldots y_N]2^q-1$. In some embodiments, the coded data packet is represented as: $[y_0+1, y_1+1, y_2+1 \ldots y_N+1]$, wherein each of the plurality of bits $y_1+1 \ldots y_N+1$ has a value from 1 to $2^q-1$. In some embodiments, base converting is an iterative process as described in reference to FIG. 3. In some embodiments, the encoding guarantees a transition at every data bit for any word size and decimation ratio. In some embodiments, the coded data stream has a guaranteed limited run-length.

The method further includes partitioning 608 the coded words into a plurality of blocks of M words each. In some embodiments, the size of a block is defined as: block size=W×M, wherein W is defined as word size and M is defined as a decimation ratio. In some embodiments, adjacent coded words have different values.

The method further includes integrating 610 the coded words in each block in an interleaved order to generate a coded data packet for transmission through a communication channel. In some embodiments, integrating the coded words includes performing exclusive or (XOR) on each incoming data bit with a result of a last XOR value from a previous data bit. In some embodiments, integrating the coded words in each block in an interleaved order results in decimated data, wherein the decimated data is expressed as $Z=\{z_i, z_{i+1}, z_{i+2} \ldots z_{i+M-1}\}$ wherein $z_i, z_{i+1} \ldots z_{i+M-1}$ are different coded bits of a coded word, Z. In some embodiments, $z_i'$ is introduced into the first data packet for a guaranteed transition in the last word of the first data packet as well.

FIG. 7 is a flow diagram depicting a method 700 of decoding transmission data, according to one or more embodiments of the present disclosure. Operations of the method 700 may be performed by the transition decoder 201 depicted in FIG. 1A or by one or more components thereof (e.g., those described above with reference to FIG. 1A-1B). It is noted that aspects of the method have already been described above in reference to FIG. 4. Therefore, for the sake of brevity, those aspects already covered are generally not repeated here.

The method 700 includes receiving 702 a plurality of sequential data bits (e.g., sequential data bits 330a-344d). In some embodiments, the plurality of sequential data bits received by receiver 20 are an infinite amount or an amount that is largely undefined. In other embodiments, the plurality of sequential data bits are a definite amount. The method further includes partitioning 704 the sequential data bits to form of a plurality of coded data packets including a first data packet (e.g., data packet 400).

The method 700 further includes decimating 706 the sequential bits of a first coded data packet, based on a decimation ratio, in an interleaved order to obtain the decimated data words.

The method 700 further includes generating 708 the difference between two adjacent decimated data words, using bit-wise XOR, to find the difference of decimated data words. In some embodiments, auxiliary words are the coded words of a data packet. In some embodiments, a data packet generates the decoded words out of the auxiliary words. In some embodiments, the size of a data packet is less than that of the auxiliary words.

The method 700 further includes decoding the auxiliary words into N words of a data packet using a reverse encoding method used by an encoder in the first encoder stage (e.g., first encoder stage 304).

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements there between. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

According to one or more embodiments of the present disclosure, however, systems and methods for efficient guaranteed transition encoding in bit streams may be provided. These and/or other aspects and features of the present disclosure will be described in more detail hereinafter with reference to the figures.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A method of encoding input data, the method comprising:
   receiving a plurality of data bits of a bit stream;
   forming words using the plurality of data bits to create a plurality of data packets including a first data packet;
   encoding the words of the first data packet into coded words;
   partitioning the coded words into a plurality of blocks of M words each; and
   based on the partitioning, integrating the coded words in each block of the plurality of blocks, in an interleaved order to generate a coded data packet for transmission through a communication channel.

2. The method of claim 1, wherein none of the coded words is an all-zero word.

3. The method of claim 1, wherein encoding the words further comprises: performing a word-wise XOR on the words of the first data packet using a unique key word, D, wherein the unique key word is defined as an overhead word.

4. The method of claim 3, wherein the unique key word is different from all the words in the first data packet.

5. The method of claim 1, wherein encoding the words in the first data packet further includes: base converting the first data packet from a first base system, $2^q$, to a second base system, $2^q-1$, resulting in a base-converted packet, wherein the second base system has a base value lower than that of the first base system.

6. The method of claim 5, wherein the first data packet is an N-digit base $2^q$ number expressed as: $X=[x_1 \ x_2 \ldots x_N]2^q$, wherein each of the data bits $x_1, x_2 \ldots x_N$ has a value from 0 to $2^q-2$, and wherein the base-converted packet is an $(2^q-1)$ digit base number expressed as $X=[y_0 \ y_1 \ y_2 \ldots y_N]2^q-1$ wherein each of a plurality of data bits $y_1 \ldots y_N$ has a value from 1 to $2^q-1$.

7. The method of claim 6, wherein the coded data packet is represented as: $[y_0+1, y_1+1, y_2+1 \ldots y_N+1]$, wherein each of a plurality of words $y_1+1 \ldots y_N+1$ has a value from 1 to $2q-1$.

8. The method of claim 5, wherein the base converting from a first base system, $2^q$ to a second base system, $2^q-1$ first is an iterative process.

9. The method of claim 1, wherein the coded words in a first block include at least a first word, a second word and a third word, wherein the first word, second word and third word each include at least a most significant bit, a second most significant bit and a least significant bit, wherein integrating the coded words in the interleaved order includes:
   a) performing exclusive or (XOR) on the most significant bit of the first word with a result of a last XOR value from a previous data bit of a previous block, the previous block being adjacent to and before the first block;
   b) performing XOR on the most significant bit of the second word with a result of a last XOR value from the most significant bit of the first word,
   c) performing XOR on the most significant bit of the third word with a result of the last XOR value from the most significant bit of the second word;
   d) performing XOR on the second most significant bit of the first word with a result of the last XOR value from the most significant bit of the third word;
   e) performing XOR on the second most significant bit of the second word with a result of the last XOR value from second the most significant bit of the first word;
   f) performing XOR on the second most significant bit of the third word with a result of the last XOR value from the second most significant bit of the second word;
   g) performing XOR on a third most significant bit of the first word with a result of the last XOR value from the second most significant bit of the third word;
   h) performing XOR on the third most significant bit of the second word with a result of the last XOR value from the third most significant bit of the first word; and
   i) performing XOR on the third most significant bit of the third word with a result of the last XOR value from the third most significant bit of the second word.

10. The method of claim 1, wherein a size of at least one of the blocks is defined as:
    block size=W×M, wherein W is defined as word size and M is defined as a decimation ratio.

11. The method of claim 1, wherein a size of at least one of the plurality of blocks is based on a word size and a decimation ratio, wherein the encoding guarantees a transition at every data bit for any word size and decimation ratio.

12. The method of claim 1, wherein the coded data packet has a guaranteed limited run-length.

13. A method for decoding transmission data, the method comprising:
    receiving a plurality of sequential data bits;
    partitioning the sequential data bits to form a plurality of coded data packets including a first coded data packet;
    decimating the sequential data bits of the first coded data packet, based on a decimation ratio, to obtain decimated data words; and
    taking a difference between two adjacent decimated data words, using bit-wise XOR, to find a coded word of the first coded data packet.

14. The method of claim 13, wherein the coded word is an auxiliary word.

15. The method of claim 14, wherein the data packet forms a decoded word out of the auxiliary word.

16. The method of claim 15, further comprising, decoding a plurality of auxiliary words into N words of the data packet using a reverse encoding method used by an encoder in a first stage.

17. A transition encoder for encoding input data, the transition encoder comprising:
- a processor;
- a processor memory local to the processor, wherein the processor memory has stored thereon instructions that, when executed by the processor, cause the processor to perform:
  - receiving a plurality of data bits of a bit stream;
  - forming words using the plurality of data bits to create a plurality of data packets including a first data packet;
  - encoding the words of the first data packet into coded words;
  - partitioning the coded words into a plurality of blocks of M words each; and
  - based on the partitioning, integrating the coded words in each block of the plurality of blocks, in an interleaved order to generate a coded data packet for transmission through a communication channel.

18. A transition decoder for decoding a transmission data, the transition decoder comprising:
- receiving a plurality of sequential data bits;
- partitioning the sequential data bits to form a plurality of coded data packets;
- decimating the data sequential bits of a first coded data packet, based on a decimation ratio, to obtain decimated data words;
- taking a difference between two adjacent decimated data words, using bit-wise XOR, to find a coded word of the first coded data packet.

19. The transition encoder of claim 17, wherein none of the coded words is an all-zero word.

20. The transition encoder of claim 17, wherein a size of at least one of the plurality of blocks is based on a word size and a decimation ratio, wherein the encoding guarantees a transition at every data bit for any word size and decimation ratio.

* * * * *